United States Patent
Gao et al.

(10) Patent No.: US 10,858,523 B2
(45) Date of Patent: Dec. 8, 2020

(54) ACHIEVING ELECTROMAGNETIC INTERFERENCE SHIELDING PROTECTION BY DEPOSITION OF HIGHLY CONDUCTIVE COMPOSITIONS

(71) Applicant: HENKEL IP & HOLDING GMBH, Duesseldorf (DE)

(72) Inventors: Junbo Gao, Concord, CA (US); Qizhuo Zhuo, Irvine, CA (US); Xinpei Cao, Irvine, CA (US); Glenda Castaneda, Long Beach, CA (US)

(73) Assignee: HENKEL IP & HOLDING GMBH, Duesseldorf (DE)

( * ) Notice: Subject to any disclaimer, the term of this patent is extended or adjusted under 35 U.S.C. 154(b) by 350 days.

(21) Appl. No.: 15/878,848

(22) Filed: Jan. 24, 2018

(65) Prior Publication Data
US 2018/0163063 A1    Jun. 14, 2018

Related U.S. Application Data

(63) Continuation of application No. PCT/US2016/044700, filed on Jul. 29, 2016.
(Continued)

(51) Int. Cl.
*C09D 5/32* (2006.01)
*H01B 1/22* (2006.01)
(Continued)

(52) U.S. Cl.
CPC .............. *C09D 5/32* (2013.01); *C08L 101/12* (2013.01); *C09D 5/24* (2013.01); *C09D 7/20* (2018.01);
(Continued)

(58) Field of Classification Search
CPC ... C09D 5/32; C09D 7/69; C09D 7/20; C09D 7/67; C09D 7/68; C09D 5/24;
(Continued)

(56) References Cited

U.S. PATENT DOCUMENTS

| | | | |
|---|---|---|---|
| 5,242,511 A | 9/1993 | Yokoyama et al. | |
| 5,717,034 A | 2/1998 | Dershem et al. | |

(Continued)

FOREIGN PATENT DOCUMENTS

| | | | |
|---|---|---|---|
| JP | 2001234075 A | 8/2001 | |
| JP | 2011-76866 A | 4/2011 | |

(Continued)

OTHER PUBLICATIONS

Burkhard et al., in Angew. Chem. Int. Ed. 2010, 49, 9052-9067.

*Primary Examiner* — William K Cheung
(74) *Attorney, Agent, or Firm* — Steven C. Bauman

(57) ABSTRACT

Provided herein are highly conductive compositions (having a volume resistivity no greater than $1\times10^{-3}$ Ohms·cm) using silver flake, powder or suspension in solvent for electromagnetic interference (EMI) applications. This high conductivity will allow the use of very thin films for EMI shielding protection, which in turn will be helpful to reduce package sizes. In some embodiments, the coating composition is applied on the device surface by suitable means, e.g., by an electrostatic spray process, air spray process, ultrasonic spray process, spin coating process, or the like.

21 Claims, 4 Drawing Sheets

Related U.S. Application Data

(60) Provisional application No. 62/200,267, filed on Aug. 3, 2015.

(51) Int. Cl.
*C08L 101/12* (2006.01)
*C09D 7/20* (2018.01)
*C09D 5/24* (2006.01)
*C09D 133/08* (2006.01)
*C09D 133/10* (2006.01)
*C09D 163/00* (2006.01)
*H05K 9/00* (2006.01)
*C09D 7/40* (2018.01)

(52) U.S. Cl.
CPC .......... *C09D 7/67* (2018.01); *C09D 7/68* (2018.01); *C09D 7/69* (2018.01); *C09D 133/08* (2013.01); *C09D 133/10* (2013.01); *C09D 163/00* (2013.01); *H01B 1/22* (2013.01); *H05K 9/0083* (2013.01); *H01L 2924/3025* (2013.01)

(58) Field of Classification Search
CPC .. C09D 133/08; C09D 133/10; C09D 163/00; C08L 101/12; H01B 1/22; H05K 9/0083; H01L 2924/3025

USPC .......................................................... 428/336
See application file for complete search history.

(56) References Cited

U.S. PATENT DOCUMENTS

| | | |
|---|---|---|
| 5,718,941 A | 2/1998 | Dershem et al. |
| 2008/0014528 A1 | 1/2008 | Bailey et al. |
| 2010/0209690 A1 | 8/2010 | Sang et al. |

FOREIGN PATENT DOCUMENTS

| | | |
|---|---|---|
| JP | 2011077068 A | 4/2011 |
| JP | 2011-187194 A | 9/2011 |
| JP | 2013-114837 A | 6/2013 |
| JP | 2013-159805 A | 8/2013 |
| JP | 2014-49380 A | 3/2014 |
| JP | 2014-181316 A | 9/2014 |
| JP | 2014-216089 A | 11/2014 |
| JP | 2015-76233 A | 4/2015 |
| WO | 2015023370 A1 | 2/2015 |
| WO | 2015023378 A1 | 2/2015 |
| WO | 2015157987 A1 | 10/2015 |
| WO | WO 2015157987 * | 10/2015 |

* cited by examiner

ACHIEVING ELECTROMAGNETIC INTERFERENCE SHIELDING PROTECTION BY DEPOSITION OF HIGHLY CONDUCTIVE COMPOSITIONS

RELATED APPLICATIONS

This application is a continuation of International Patent Application No. PCT/US2016/044700 filed Jul. 29, 2016, which claims the benefit of U.S. Provisional patent application No. 62/200,267, filed Aug. 3, 2015, the contents of both which are incorporated herein by reference.

FIELD OF THE INVENTION

The present invention relates to highly electrically conductive compositions and methods for the uniform, three-dimensional application thereof on suitable substrates (e.g., on an epoxy molding compound (EMC) surface) employing suitable means, e.g., by electrostatic spray processing, air spray processing, ultrasonic spray processing, spin coating processing, and the like. Highly efficient electromagnetic interference shielding (EMI) protection for electronic packages has been demonstrated with very thin coating thickness. The present invention also relates to films prepared using invention formulations and methods. In another aspect, the invention relates to articles comprising films as described herein adhered to a suitable substrate therefor. In still another aspect, the present invention also relates to methods of making conductive films which impart electromagnetic interference shielding (EMI) protection to an electronic component. In yet another aspect, the present invention is also related to methods for imparting electromagnetic interference shielding (EMI) protection to an electronic component.

BACKGROUND OF THE INVENTION

EMI shielding is the practice of reducing the electromagnetic field in a space by blocking the field with barriers made of conductive or magnetic materials. Shielding is typically applied to enclosures to isolate electrical devices from the 'outside world'. Electromagnetic shielding that blocks radio frequency electromagnetic radiation is also known as RF shielding.

EMI shielding can reduce the coupling of radio waves, electromagnetic fields and electrostatic fields. A conductive enclosure used to block electrostatic fields is also known as a Faraday cage. The amount of reduction one can achieve depends upon such factors as the material used, its thickness, the conductivity of the coatings, the frequency of the fields of interest, and the like.

Typical materials used for electromagnetic shielding include formed sheet metal (i.e., a metal can), and metal coatings applied by plating and/or sputtering processes. Another commonly used shielding method, especially with electronic goods housed in plastic enclosures, is the use of conductive coatings.

Formed metal sheets are typically used for board level shielding in which the metal can is applied on an electronic package. Due to the dimensions thereof, this method is not suitable for very small designs and is not very flexible in application.

Plating methods can provide full coverage on electronic packages and potentially have good thickness control. Such methods have very good unit per hour productivity (UPH) and relatively low material cost. However, these methods require pre-treatment of the surface to be coated and require laborious masking of the substrate.

Sputter methods are well-known and widely accepted processes for EMI shielding applications. Such methods typically incur low material costs, yet are able to provide very effective EMI shielding due to the high electrical conductivity of the coating. However, such methods require the use of very expensive equipment; moreover, its UPH is very low.

Currently, conductive paste adhesives are commonly used for EMI shielding protection. Unfortunately, however, when the paste adhesive doesn't have high electrical conductivity, very thick films are needed in order to achieve the desired shielding performance.

Conductive coatings provide EMI protection to electronic packages with a conductive composition, which consists of a carrier material including thermoset and thermoplastic, loaded with a suitable metal, typically silver, copper, nickel, or the like, in the form of very small particulates. The coating is usually applied by a spray or printing process on the electronic package and once dry, produces a continuous conductive layer, which can be electrically connected to the chassis ground of the equipment, thus providing effective shielding. A limitation of this method is that the EMI shielding effectiveness is not as good as pure metal sheet or metal coatings provided by plating and sputtering (due to the inferior electrical conductivity of the conductive coatings). Another limitation is that it is difficult to produce a uniform, three-dimensional thin coating on an electronic package by regular spray or printing processes.

These and other limitations of prior art methods are hereby addressed by the present invention.

SUMMARY OF THE INVENTION

In accordance with the present invention, there are provided highly conductive compositions which are useful for applying conductive material to a suitable substrate; the resulting coated articles have improved EMI shielding performance relative to articles coated with prior art formulations employing prior art methods.

In accordance with certain aspects of the present invention, there are also provided methods for the preparation of conductive films and articles shielded thereby. Invention methods contemplate the use of a variety of application methods, e.g., electrostatic spray processing, air spray processing, ultrasonic spray processing, spin coating processing, and the like, to achieve a substantially uniform three-dimensional thin conductive coating on the surface of an electronic package. Effective EMI shielding has been demonstrated with very thin coating thickness. For example, for a rectangular EMC block, three-dimensional coating means the conductive compositions substantially uniformly cover the top surface and four side walls of the block (see, for example, FIG. 1).

Electrostatic spray processing typically uses very high voltage (~10 KV) to dispense coating material to a substrate, during which the electric force overcomes the surface tension of the coating solution, and droplets of the coating material split into charged fine mist (nano size dropets). Driven by the electric field strength, the charged fine mist will then be accelerated toward a workpiece. Compared with other spray processes, the mist created by electrostatic spray processing tends, in certain embodiments, to be much finer, thereby facilitating control of the coating foot print. This facilitates, in some embodiments, making three dimensional thin coatings on the surface of an electronic package.

Air spray processing is carried out using an air-pressurized spray gun. The air gun has a nozzle, a paint basin, and an air compressor. When the trigger is pressed the paint mixes with the compressed air stream and is released in a fine spray.

Ultrasonic spray is a coating method that uses high frequency sound waves produced by piezoelectric transducers acting upon the spray nozzle tip, which will atomize the coating liquid and create tiny droplets to coat on the coating object surface.

Compared with an air spray process, the mist created by an electrostatic spray process is much finer and the coating foot print is much easier to control. This allows one to make three dimensional thin coatings on the surface of an electronic package with almost 1 to 1 ratio of the side wall coating thickness to top surface coating thickness. The mist of the ultrasonic spray is similar to that of electrostatic spray, therefore the coating quality by this method is similar to that obtained with the electrostatic method.

In accordance with the present invention, the limitations of the prior art have been overcome and the excellent performance of invention compositions, and methods for preparing and using same, have been demonstrated as follows:

Invention compositions, applied three-dimensionally on an EMC surface (e.g., by electrostatic spray, air spray process, ultrasonic spray process, spin coating process, or the like), provide a three-dimensional thin conductive coating on the EMC surface. The thin coating shows excellent adhesion on EMC.

High conductivity compositions according to the invention improve the EMI shielding performance thereof; effective EMI shielding performance is achieved at a coating thickness as low as 1-2 μm.

much higher UPH is obtained with invention formulations, relative to that obtained with sputter coatings; moreover, invention methods provide similar metal coatings compared with coatings prepared by sputter and plate processes.

In certain aspects of the present invention, there are also provided films prepared using invention formulations and methods. In additional aspects of the present invention, there are also provided articles comprising films as described herein adhered to a suitable substrate therefor.

In summary highly conductive compositions (and methods for the preparation thereof) have been demonstrated herein. These highly conductive compositions can be applied to an EMC surface by a variety of methods, e.g., by electrostatic spray process, air spray process, ultrasonic spray process, spin coating process, or the like. Uniform three-dimensional thin coatings have been achieved on an EMC surface (see, for example, FIG. 1). Testing results show these highly conductive compositions are able to provide very effective EMI shielding protection for electronic packages with very thin thickness.

The present invention is unique at least for providing the following combination of desirable performance properties:
a. Good EMI shielding effectiveness (e.g., 20 dB or better),
b. High conductivity with a low curing temperature,
c. Very thin, but uniform coatings; and
d. Three-dimensional EMI shielding coating for IC package protection.

DETAILED DESCRIPTION OF THE INVENTION

Figure 1:
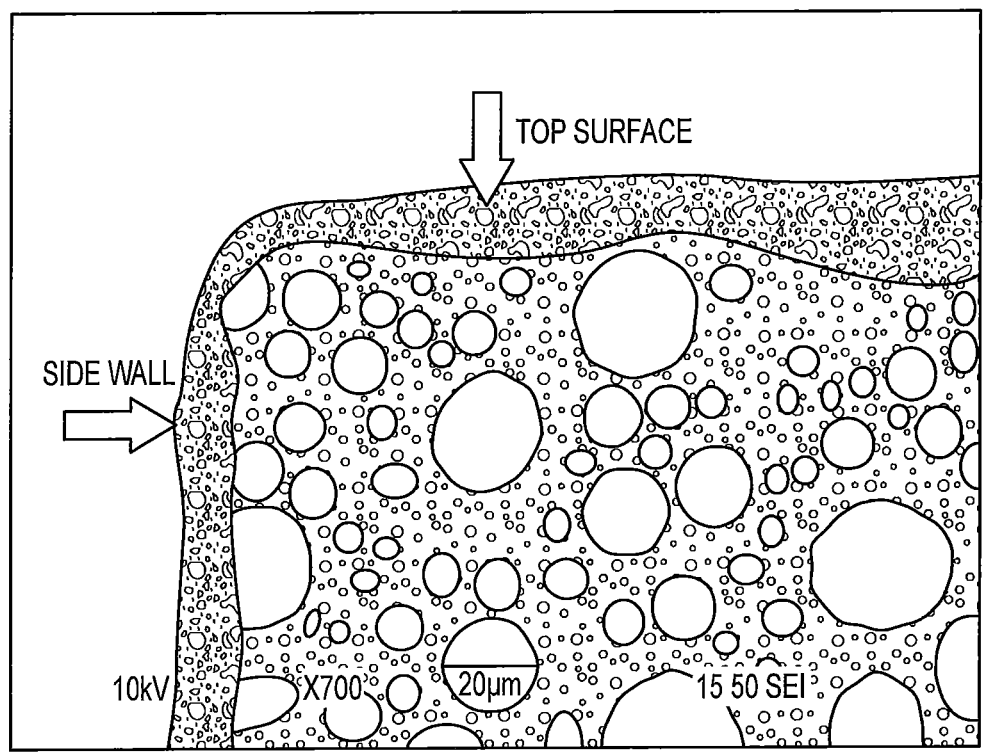
FIG. 1 illustrates the results of applying a conductive coating to the top surface and side walls of a device for which EMI shielding is desired employing invention methods.

In accordance with the present invention, there are provided electrically conductive compositions comprising:
in the range of about 10 up to 98.99 wt % of a particulate, conductive filler;
in the range of about 0.01 up to about 40 wt % of an organic matrix; and
in the range of about 1 up to about 80 wt % of an organic diluent;
wherein:
said particulate, conductive filler is selected from the group consisting of gold, silver, copper, platinum, palladium, nickel, aluminum, indium, alloy of nickel (e.g., alloy 42), alloy of zinc, alloy of iron, alloy of indium, silver-plated copper, silver-plated aluminum, bismuth, tin, bismuth-tin alloy, silver-plated fiber, silver-plated graphite, silver-plated silicon carbide, silver-plated boron nitride, silver-plated diamond, silver-plated alumina, silver-plated alloy 42, cadmium and alloys of cadmium, lead and alloys of lead, antimony and alloys of antimony, and mixtures of any two or more thereof; and said particulate, conductive filler has a particle size in the range of about 1 nm up to about 50 μm;
said organic matrix comprises at least one thermoplastic and/or at least one thermoset resin; and
said organic diluent is selected from the group consisting of aromatic hydrocarbons, saturated hydrocarbons, chlorinated hydrocarbons ethers, polyols, esters, dibasic esters, alpha-terpineol, beta-terpineol, kerosene, dibutylphthalate, butyl carbitol, butyl carbitol acetate, carbitol acetate, ethyl carbitol acetate, hexylene glycol, high boiling alcohols and esters thereof, glycol ethers, ketones, amides, heteroaromatic compounds, as well as mixtures of any two or more thereof; and
wherein said composition, upon exposure to an elevated temperature no greater than about 250° C.:
provides electromagnetic interference shielding (EMI) protection of at least 20 dB for electronic packages,
has a volume resistivity less than $1 \times 10^{-3}$ Ohms·cm when said composition is applied by suitable means, e.g., by an electrostatic spray process, air spray process, ultrasonic spray process, spin coating process, or the like, to a suitable three-dimensional substrate at a thickness of less than 25 μm, and
has good adhesion to said substrate.

For a rectangular EMC block, three-dimensional coating means the conductive compositions cover the top surface and four side walls of the block.

The EMI effectiveness can be measured in a variety of ways, e.g., employing a waveguide system (1.7-2.8 GHz) which includes two waveguide-to-coaxial adapters and a vector network analyzer. The sample is prepared as a thin film layer with the target thickness coated on a PET film. The sample size is 5×3 inches. The material is suitable for application with >14 KHz frequency and gives better performance at >1 GHz.

Fillers

In accordance with the present invention, the particulate, conductive filler employed herein is present in the range of about 10 up to about 98.99 wt % of invention compositions; in some embodiments, invention formulations comprise in the range of about 10 up to about 95 wt % of a particulate, conductive filler; in some embodiments, invention formulations comprise in the range of about 10 up to about 90 wt % of a particulate, conductive filler; in some embodiments, invention formulations comprise in the range of about 10 up to about 80 wt % of a particulate, conductive filler; in some embodiments, invention formulations comprise in the range of about 10 up to about 70 wt % of a particulate, conductive filler; 20 up to about 98.99 wt % of invention compositions; in some embodiments, invention formulations comprise in the range of about 20 up to about 95 wt % of a particulate, conductive filler; in some embodiments, invention formulations comprise in the range of about 20 up to about 90 wt % of a particulate, conductive filler; in some embodiments, invention formulations comprise in the range of about 20 up to about 80 wt % of a particulate, conductive filler; in some embodiments, invention formulations comprise in the range of about 20 up to about 70 wt % of a particulate, conductive filler; 30 up to about 98.99 wt % of invention compositions; in some embodiments, invention formulations comprise in the range of about 30 up to about 95 wt % of a particulate, conductive filler; in some embodiments, invention formulations comprise in the range of about 30 up to about 90 wt % of a particulate, conductive filler; in some embodiments, invention formulations comprise in the range of about 30 up to about 80 wt % of a particulate, conductive filler; in some embodiments, invention formulations comprise in the range of about 30 up to about 70 wt % of a particulate, conductive filler; in some embodiments, invention formulations comprise in the range of about 40 up to about 95 wt % of a particulate, conductive filler; in some embodiments, invention formulations comprise in the range of about 40 up to about 90 wt % of a particulate, conductive filler; in some embodiments, invention formulations comprise in the range of about 40 up to about 80 wt % of a particulate, conductive filler; in some embodiments, invention formulations comprise in the range of about 40 up to about 70 wt % of a particulate, conductive filler; in some embodiments, invention formulations comprise in the range of about 40 up to about 60 wt % of a particulate, conductive filler.

Particulate, conductive fillers employed herein can be substantially nanoparticulate, or the particulate, conductive fillers employed herein can be substantially larger, non-nanoparticulate, or the particulate, conductive filler employed herein can be a combination of nanoparticulate and non-nanoparticulate.

For example, in some embodiments of the present invention, up to 100 wt % of the particulate, conductive filler employed herein has a particle size in the range of about 2-1000 nanometers, and an average particle size in the range of about 2-1000 nm, and the remaining particulate, conductive filler has a particle size no greater than 50 microns.

In some embodiments of the present invention, up to 100 wt % of the particulate, conductive filler employed herein has a particle size no greater than 50 microns, and an average particle size in the range of about 1-25 µm.

In some embodiments of the present invention, up to 10 wt % of the particulate, conductive filler employed herein has a particle size in the range of about 2-1000 nanometers; in some embodiments, up to 20 wt % of the particulate, conductive filler employed in the practice of the present invention has a particle size in the range of about 2-1000 nanometers; in some embodiments, up to 30 wt % of the particulate, conductive filler employed in the practice of the present invention has a particle size in the range of about 2-1000 nanometers; in some embodiments, up to 40 wt % of the particulate, conductive filler employed in the practice of the present invention has a particle size in the range of about 2-1000 nanometers; in some embodiments, up to 50 wt % of the particulate, conductive filler employed in the practice of the present invention has a particle size in the range of about 2-1000 nanometers; in some embodiments, up to 60 wt % of the particulate, conductive filler employed in the practice of the present invention has a particle size in the range of about 2-1000 nanometers; in some embodiments, up to 70 wt % of the particulate, conductive filler employed in the practice of the present invention has a particle size in the range of about 2-1000 nanometers; in some embodiments, up to 80 wt % of the particulate, conductive filler employed in the practice of the present invention has a particle size in the range of about 2-1000 nanometers; in some embodiments, up to 90 wt % of the particulate, conductive filler employed in the practice of the present invention has a particle size in the range of about 2-1000 nanometers.

In some embodiments, up to 10 wt % of the particulate, conductive filler employed in the practice of the present invention has a particle size in the range of about 2-500 nanometers; in some embodiments, up to 20 wt % of the particulate, conductive filler employed in the practice of the present invention has a particle size in the range of about 2-500 nanometers; in some embodiments, up to 30 wt % of the particulate, conductive filler employed in the practice of the present invention has a particle size in the range of about 2-500 nanometers; in some embodiments, up to 40 wt % of the particulate, conductive filler employed in the practice of the present invention has a particle size in the range of about 2-500 nanometers; in some embodiments, up to 50 wt % of the particulate, conductive filler employed in the practice of the present invention has a particle size in the range of about 2-500 nanometers; in some embodiments, up to 60 wt % of the particulate, conductive filler employed in the practice of the present invention has a particle size in the range of about 2-500 nanometers; in some embodiments, up to 70 wt % of the particulate, conductive filler employed in the practice of the present invention has a particle size in the range of about 2-500 nanometers; in some embodiments, up to 80 wt % of the particulate, conductive filler employed in the practice of the present invention has a particle size in the range of about 2-500 nanometers; in some embodiments, up to 90 wt % of the particulate, conductive filler employed in the practice of the present invention has a particle size in the range of about 2-500 nanometers.

In some embodiments, up to 10 wt % of the particulate, conductive filler employed in the practice of the present invention has a particle size no greater than 50 microns, and an average particle size in the range of about 1-25 µm; in some embodiments, up to 20 wt % of the particulate, conductive filler employed in the practice of the present invention has a particle size no greater than 50 microns, and an average particle size in the range of about 1-25 µm; in some embodiments, up to 30 wt % of the particulate, conductive filler employed in the practice of the present invention has a particle size no greater than 50 microns, and an average particle size in the range of about 1-25 µm; in some embodiments, up to 40 wt % of the particulate, conductive filler employed in the practice of the present invention has a particle size no greater than 50 microns, and an average particle size in the range of about 1-25 µm; in some embodiments, up to 50 wt % of the particulate, conductive filler employed in the practice of the present invention has a particle size no greater than 50 microns, and an average particle size in the range of about 1-25 µm; in some embodiments, up to 60 wt % of the particulate, conductive filler employed in the practice of the present invention has a particle size no greater than 50 microns, and an average particle size in the range of about 1-25 µm; in some embodiments, up to 70 wt % of the particulate, conductive filler employed in the practice of the present invention has a particle size no greater than 50 microns, and an average particle size in the range of about 1-25 µm; in some embodiments, up to 80 wt % of the particulate, conductive filler employed in the practice of the present invention has a particle size no greater than 50 microns, and an average particle size in the range of about 1-25 µm; in some embodiments, up to 90 wt % of the particulate, conductive filler employed in the practice of the present invention has a particle size no greater than 50 microns, and an average particle size in the range of about 1-25 µm.

In some embodiments, up to 10 wt % of the particulate, conductive filler employed in the practice of the present invention has a particle size no greater than 50 microns, and an average particle size in the range of about 10 nanometers-10 µm; in some embodiments, up to 20 wt % of the particulate, conductive filler employed in the practice of the present invention has a particle size no greater than 50 microns, and an average particle size in the range of about 10 nanometers-10 µm; in some embodiments, up to 30 wt % of the particulate, conductive filler employed in the practice of the present invention has a particle size no greater than 50 microns, and an average particle size in the range of about 10 nanometers-10 µm; in some embodiments, up to 40 wt % of the particulate, conductive filler employed in the practice of the present invention has a particle size no greater than 50 microns, and an average particle size in the range of about 10 nanometers-10 µm; in some embodiments, up to 50 wt % of the particulate, conductive filler employed in the practice of the present invention has a particle size no greater than 50 microns, and an average particle size in the range of about 10 nanometers-10 µm; in some embodiments, up to 60 wt % of the particulate, conductive filler employed in the practice of the present invention has a particle size no greater than 50 microns, and an average particle size in the range of about 10 nanometers-10 µm; in some embodiments, up to 70 wt % of the particulate, conductive filler employed in the practice of the present invention has a particle size no greater than 50 microns, and an average particle size in the range of about 10 nanometers-10 µm; in some embodiments, up to 80 wt % of the particulate, conductive filler employed in the practice of the present invention has a particle size no greater than 50 microns, and an average particle size in the range of about 10 nanometers-10 µm; in some embodiments, up to 90 wt % of the particulate, conductive filler employed in the practice of the present invention has a particle size no greater than 50 microns, and an average particle size in the range of about 10 nanometers-10 µm.

Organic Matrices

A wide variety of organic matrices are contemplated for use herein; exemplary organic matrices comprise at least one thermoplastic resin and/or at least one thermoset resin.

Organic matrices employed herein are present in the range of about 0.01 up to about 40 wt % of invention compositions; in some embodiments, invention formulations comprise in the range of about 0.05 up to about 40 wt % organic matrix; in some embodiments, invention formulations comprise in the range of about 0.1 up to about 40 wt % of organic matrix; in some embodiments, invention formulations comprise in the range of about 0.5 up to about 40 wt % of organic matrix; in some embodiments, invention formulations comprise in the range of about 1 up to about 40 wt % of organic matrix; in some embodiments, invention formulations comprise in the range of about 2 up to about 40 wt % of organic matrix; in some embodiments, invention formulations comprise in the range of about 3 up to about 40 wt % of organic matrix; in some embodiments, invention formulations comprise in the range of about 4 up to about 40 wt % of organic matrix; in some embodiments, invention formulations comprise in the range of about 5 up to about 40 wt % of organic matrix.

In some embodiments, organic matrices employed herein are present in the range of about 0.01 up to about 30 wt % of invention compositions; in some embodiments, invention formulations comprise in the range of about 0.05 up to about 30 wt % organic matrix; in some embodiments, invention formulations comprise in the range of about 0.1 up to about 30 wt % of organic matrix; in some embodiments, invention formulations comprise in the range of about 0.5 up to about 30 wt % of organic matrix; in some embodiments, invention formulations comprise in the range of about 1 up to about 30 wt % of organic matrix; in some embodiments, invention formulations comprise in the range of about 2 up to about 30 wt % of organic matrix; in some embodiments, invention formulations comprise in the range of about 3 up to about 30 wt % of organic matrix; in some embodiments, invention formulations comprise in the range of about 4 up to about 30 wt % of organic matrix; in some embodiments, invention formulations comprise in the range of about 5 up to about 30 wt % of organic matrix.

In some embodiments, organic matrices employed herein are present in the range of about 0.01 up to about 20 wt % of invention compositions; in some embodiments, invention formulations comprise in the range of about 0.05 up to about 20 wt % organic matrix; in some embodiments, invention formulations comprise in the range of about 0.1 up to about 20 wt % of organic matrix; in some embodiments, invention formulations comprise in the range of about 0.5 up to about 20 wt % of organic matrix; in some embodiments, invention formulations comprise in the range of about 1 up to about 20 wt % of organic matrix; in some embodiments, invention formulations comprise in the range of about 2 up to about 20 wt % of organic matrix; in some embodiments, invention formulations comprise in the range of about 3 up to about 20 wt % of organic matrix; in some embodiments, invention formulations comprise in the range of about 4 up to about 20 wt % of organic matrix; in some embodiments, invention formulations comprise in the range of about 5 up to about 20 wt % of organic matrix.

In some embodiments, organic matrices employed herein are present in the range of about 0.01 up to about 10 wt % of invention compositions; in some embodiments, invention formulations comprise in the range of about 0.05 up to about 10 wt % organic matrix; in some embodiments, invention formulations comprise in the range of about 0.1 up to about 10 wt % of organic matrix; in some embodiments, invention formulations comprise in the range of about 0.5 up to about 10 wt % of organic matrix; in some embodiments, invention formulations comprise in the range of about 1 up to about 10 wt % of organic matrix; in some embodiments, invention formulations comprise in the range of about 2 up to about 10 wt % of organic matrix; in some embodiments, invention formulations comprise in the range of about 3 up to about 10 wt % of organic matrix; in some embodiments, invention formulations comprise in the range of about 4 up to about 10 wt % of organic matrix; in some embodiments, invention formulations comprise in the range of about 5 up to about 10 wt % of organic matrix.

Exemplary thermoplastic resins are selected from the group consisting of polyesters, polyacrylates (e.g., poly (methacrylate), poly(butyl methacrylate), polyurethanes, phenoxies, polyethyloxyazoline, polyvinyl pyrrolidone, polyvinyl alcohol, polyacrylamide, polyglycol, and polyacrylic acid; poly(ethylene glycol), an aromatic vinyl polymer, flexible epoxy, polymer with epoxy functional groups, Poly carbonate, ABS, PC/ABS alloys, nylon, inherently conductive polymer, silicone polymer, siloxane polymer, rubbers, polyolefins, vinyls polymer, polyamides, fluoropolymers polyphenylene ethers, co-polyestercarbonates, acrylonitrile butadiene styrene copolymers, polyarylate ether sulfones or ketones, polyamide imides, polyetherimides, poly(ethylene terephthalate), poly(1,4-butylene terephthalate), polyethylenes, polypropylenes, polypropylene-EPDM blends, butadienes, styrene-butadienes, nitriles, chlorosulfonates, neoprenes, acrylonitrile butadiene styrene copolymers, polyetheresters, styrene/acrylonitrile polymer, polyphenylene sulfide, nitrile rubbers, cellulose resin, as well as mixtures of any two or more thereof.

In addition to the presence of at least one thermoplastic resin, organic matrices contemplated for use herein optionally further comprise at least one thermoset resin; exemplary thermoset resins include epoxies, acrylics, acrylates, acrylate esters, vinyl, maleimides, nadimides, itaconimides, cyanate esters, alkyd resins cyanate esters, phenolics, benzoxazines, polyimides, functionalized polyimides, oxetanes, vinyl ether, polyurethanes, melamines, urea-formaldehyde resins, phenol-formaldehyde resins, silicone, melamines, and the like, as well as mixtures of any two or more thereof.
Epoxies A wide variety of epoxy-functionalized resins are contemplated for use herein, e.g., liquid-type epoxy resins based on bisphenol A, solid-type epoxy resins based on bisphenol A, liquid-type epoxy resins based on bisphenol F (e.g., Epiclon EXA-835LV), multifunctional epoxy resins based on phenol-novolac resin, dicyclopentadiene-type epoxy resins (e.g., Epiclon HP-7200L), naphthalene-type epoxy resins, and the like, as well as mixtures of any two or more thereof.

Exemplary epoxy-functionalized resins contemplated for use herein include the diepoxide of the cycloaliphatic alcohol, hydrogenated bisphenol A (commercially available as Epalloy 5000), a difunctional cycloaliphatic glycidyl ester of hexahydrophthallic anhydride (commercially available as Epalloy 5200), Epiclon EXA-835LV, Epiclon HP-7200L, and the like, as well as mixtures of any two or more thereof.

In certain embodiments, the epoxy component may include the combination of two or more different bisphenol based epoxies. These bisphenol based epoxies may be selected from bisphenol A, bisphenol F, or bisphenol S epoxies, or combinations thereof. In addition, two or more different bisphenol epoxies within the same type of resin (such A, F or S) may be used.

Commercially available examples of the bisphenol epoxies contemplated for use herein include bisphenol-F-type epoxies (such as RE-404-S from Nippon Kayaku, Japan, and EPICLON 830 (RE1801), 830S (RE1815), 830A (RE1826) and 830W from Dai Nippon Ink & Chemicals, Inc., and RSL 1738 and YL-983U from Resolution) and bisphenol-A-type epoxies (such as YL-979 and 980 from Resolution).

The bisphenol epoxies available commercially from Dai Nippon and noted above are promoted as liquid undiluted epichlorohydrin-bisphenol F epoxies having much lower viscosities than conventional epoxies based on bisphenol A epoxies and have physical properties similar to liquid bisphenol A epoxies. Bisphenol F epoxy has lower viscosity than bisphenol A epoxies, all else being the same between the two types of epoxies, which affords a lower viscosity and thus a fast flow underfill sealant material. The EEW of these four bisphenol F epoxies is between 165 and 180. The viscosity at 25° C. is between 3,000 and 4,500 cps (except for RE1801 whose upper viscosity limit is 4,000 cps). The hydrolyzable chloride content is reported as 200 ppm for RE1815 and 830W, and that for RE1826 as 100 ppm.

The bisphenol epoxies available commercially from Resolution and noted above are promoted as low chloride containing liquid epoxies. The bisphenol A epoxies have a EEW (g/eq) of between 180 and 195 and a viscosity at 25° C. of between 100 and 250 cps. The total chloride content for YL-979 is reported as between 500 and 700 ppm, and that for YL-980 as between 100 and 300 ppm. The bisphenol F epoxies have a EEW (g/eq) of between 165 and 180 and a viscosity at 25° C. of between 30 and 60. The total chloride content for RSL-1738 is reported as between 500 and 700 ppm, and that for YL-983U as between 150 and 350 ppm.

In addition to the bisphenol epoxies, other epoxy compounds are contemplated for use as the epoxy component of invention formulations. For instance, cycloaliphatic epoxies, such as 3,4-epoxycyclohexylmethyl-3,4-epoxycyclohexylcarbonate, can be used. Also monofunctional, difunctional or multifunctional reactive diluents may be used to adjust the viscosity and/or lower the Tg of the resulting resin material. Exemplary reactive diluents include butyl glycidyl ether, cresyl glycidyl ether, polyethylene glycol glycidyl ether, polypropylene glycol glycidyl ether, and the like.

Epoxies suitable for use herein include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

Appropriate monofunctional epoxy coreactant diluents for optional use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters, $C_{6-28}$ alkylphenol glycidyl ethers, and the like.

In the event such a monofunctional epoxy coreactant diluent is included, such coreactant diluent should be employed in an amount from about 0.5 percent by weight to about 10 percent by weight, based on the total weight of the composition; in some embodiments, such coreactant diluent should be employed in an amount from about 0.25 percent by weight to about 5 percent by weight, based on the total weight of the composition.

The epoxy component should be present in the composition in an amount in the range of about 1 percent by weight to about 40 percent by weight; in some embodiments, invention formulations comprise about 2 percent by weight to about 18 percent by weight epoxy; in some embodiments, invention formulations comprise about 5 to about 15 percent by weight epoxy.

In some embodiments, the epoxy component employed herein is a silane modified epoxy, e.g., a composition of matter that includes:

(A) an epoxy component embraced by the following structure:

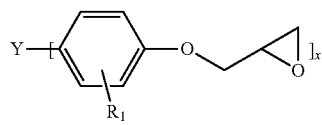

where:
Y may or may not be present and when Y present is a direct bond, $CH_2$, $CH(CH_3)_2$, C=O, or S,
$R_1$ here is alkyl, alkenyl, hydroxy, carboxy and halogen, and
x here is 1-4;

(B) an epoxy-functionalized alkoxy silane embraced by the following structure:

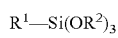

$R^1$—Si(OR$^2$)$_3$ wherein
$R^1$ is an oxirane-containing moiety and
$R^2$ is an alkyl or alkoxy-substituted alkyl, aryl, or aralkyl group having from one to ten carbon atoms; and (C) reaction products of components (A) and (B).

An example of one such silane-modified epoxy is formed as the reaction product of an aromatic epoxy, such as a bisphenol A, E, F or S epoxy or biphenyl epoxy, and epoxy silane where the epoxy silane is embraced by the following structure:

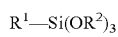

$R^1$—Si(OR$^2$)$_3$ wherein
$R^1$ is an oxirane-containing moiety, examples of which include 2-(ethoxymethyl)oxirane, 2-(propoxymethyl)oxirane, 2-(methoxymethyl)oxirane, and 2-(3-methoxypropyl)oxirane and
$R^2$ is an alkyl or alkoxy-substituted alkyl, aryl, or aralkyl group having from one to ten carbon atoms.

In one embodiment, $R^1$ is 2-(ethoxymethyl)oxirane and $R^2$ is methyl.

Idealized structures of the aromatic epoxy used to prepare the silane modified epoxy include

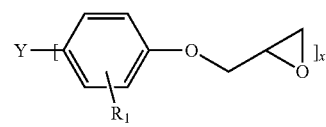

wherein
Y may or may not be present, and when Y is present, it is a direct bond, $CH_2$, $CH(CH_3)_2$, C=O, or S,
$R_1$ is alkyl, alkenyl, hydroxy, carboxy or halogen, and
x is 1-4.

Of course, when x is 2-4, chain extended versions of the aromatic epoxy are also contemplated as being embraced by this structure.

For instance, a chain extended version of the aromatic epoxy may be embraced by the structure below

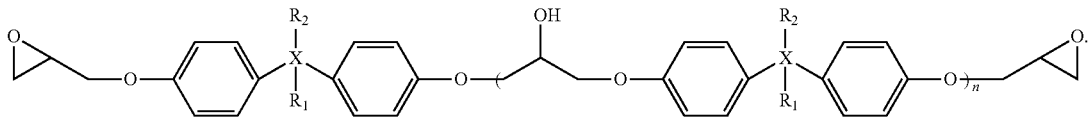

In some embodiments, the siloxane modified epoxy resin has the structure:

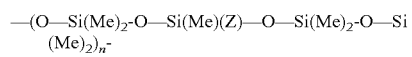

—(O—Si(Me)$_2$-O—Si(Me)(Z)—O—Si(Me)$_2$-O—Si(Me)$_2$)$_n$- wherein:
Z is —O—(CH$_2$)$_3$—O-Ph-CH$_2$-Ph-O—(CH$_2$—CH(OH)—CH$_2$—O-Ph-CH$_2$-Ph-O—)$_n$—CH$_2$-oxirane, and
n falls in the range of about 1-4.

In some embodiments, the siloxane modified epoxy resin is produced by contacting a combination of the following components under conditions suitable to promote the reaction thereof:

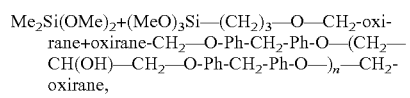

Me$_2$Si(OMe)$_2$+(MeO)$_3$Si—(CH$_2$)$_3$—O—CH$_2$-oxirane+oxirane-CH$_2$—O-Ph-CH$_2$-Ph-O—(CH$_2$—CH(OH)—CH$_2$—O-Ph-CH$_2$-Ph-O—)$_n$—CH$_2$-oxirane, wherein "n" falls in the range of about 1-4.

The silane modified epoxy may also be a combination of the aromatic epoxy, the epoxy silane, and reaction products of the aromatic epoxy and the epoxy silane. The reaction products may be prepared from the aromatic epoxy and epoxy silane in a weight ratio of 1:100 to 100:1, such as a weight ratio of 1:10 to 10:1.

Quantities of epoxy monomer(s) contemplated for use in invention compositions are sufficient so that the resulting formulation comprises in the range of about 1-20 wt % of said epoxy. In certain embodiments, the resulting formulation comprises in the range of about 2-18 wt % of said epoxy. In certain embodiments, the resulting formulation comprises in the range of about 5-15 wt % of said epoxy.

Epoxy cure agents are optionally employed in combination with epoxy monomer(s). Exemplary epoxy cure agents include ureas, aliphatic and aromatic amines, amine hardeners, polyamides, imidazoles, dicyandiamides, hydrazides, urea-amine hybrid curing systems, free radical initiators (e.g., peroxy esters, peroxy carbonates, hydroperoxides, alkylperoxides, arylperoxides, azo compounds, and the like), organic bases, transition metal catalysts, phenols, acid anhydrides, Lewis acids, Lewis bases, and the like.

When epoxy cure agents are present, invention compositions comprise in the range of about 0.1-2 wt % thereof. In certain embodiments, invention compositions comprise in the range of about 0.5-5 wt % of epoxy cure agent.

Maleimides, Nadimides or Itaconimides

Maleimides, nadimides or itaconimides contemplated for use herein are compounds having the structure:

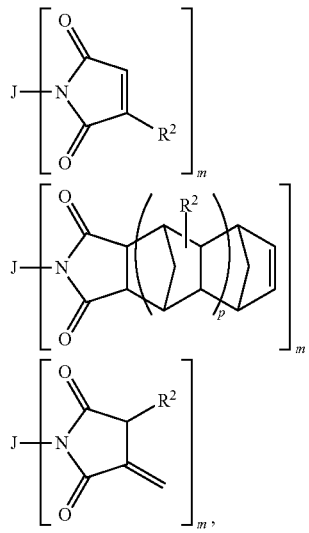

respectively,
wherein:
m is 1-15,
p is 0-15,
each $R^2$ is independently selected from hydrogen or lower alkyl (such as $C_{1-5}$), and
J is a monovalent or a polyvalent radical comprising organic or organosiloxane radicals, and
combinations of two or more thereof.

In some embodiments of the present invention, J is a monovalent or polyvalent radical selected from:
hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, aryalkenyl, alkenylaryl, arylalky-nyl or alkynylaryl, provided, however, that X can be aryl only when X comprises a combination of two or more different species;
hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalky-nylene or alkynylarylene,
heterocyclic or substituted heterocyclic species typically having in the range of about 6 up to about 500 carbon atoms,
polysiloxane, or
polysiloxane-polyurethane block copolymers, as well as combinations of one or more of the above with a linker selected from covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—; where each R is independently hydrogen, alkyl or substituted alkyl.

Exemplary compositions include those wherein J is oxy-alkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxy-cloalkenyl, thiocycloalkenyl, aminocycloalkenyl, carboxy-cycloalkenyl, heterocyclic, oxyheterocyclic, thioheterocy-clic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyal-kylaryl, thioalkylaryl, aminoalkylaryl, carboxyalkylaryl, oxyarylalkyl, thioarylalkyl, aminoarylalkyl, carboxyarylal-kyl, oxyarylalkenyl, thioarylalkenyl, aminoarylalkenyl, car-boxyarylalkenyl, oxyalkenylaryl, thioalkenylaryl, aminoalk-enylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or car-boxyalkynylaryl, oxyalkylene, thioalkylene, aminoalkylene, carboxyalkylene, oxyalkenylene, thioalkenylene, aminoalk-enylene, carboxyalkenylene, oxyalkynylene, thioalky-nylene, aminoalkynylene, carboxyalkynylene, oxycycloal-kylene, thiocycloalkylene, aminocycloalkylene, carboxycycloalkylene, oxycycloalkenylene, thiocycloalk-enylene, aminocycloalkenylene, carboxycycloalkenylene, oxyarylene, thioarylene, aminoarylene, carboxyarylene, oxyalkylarylene, thioalkylarylene, aminoalkylarylene, car-boxyalkylarylene, oxyarylalkylene, thioarylalkylene, ami-noarylalkylene, carboxyarylalkylene, oxyarylalkenylene, thioarylalkenylene, aminoarylalkenylene, carboxyarylalk-enylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, amino alkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, or a carboxyheteroatom-containing di- or polyvalent cyclic moiety.

Acrylates

Acrylates contemplated for use in the practice of the present invention are well known in the art. See, for example, U.S. Pat. No. 5,717,034, the entire contents of which are hereby incorporated by reference herein.

Exemplary acrylates contemplated for use herein include monofunctional (meth)acrylates, difunctional (meth)acrylates, trifunctional (meth)acrylates, polyfunctional (meth)acrylates, and the like.

Exemplary monofunctional (meth)acrylates include phenylphenol acrylate, methoxypolyethylene acrylate, acryloyloxyethyl succinate, fatty acid acrylate, methacryloyloxyethylphthalic acid, phenoxyethylene glycol methacrylate, fatty acid methacrylate, β-carboxyethyl acrylate, isobornyl acrylate, isobutyl acrylate, t-butyl acrylate, hydroxyethyl acrylate, hydroxypropyl acrylate, dihydrocyclopentadiethyl acrylate, cyclohexyl methacrylate, t-butyl methacrylate, dimethylaminoethyl methacrylate, diethylaminoethyl methacrylate, t-butylaminoethyl methacrylate, 4-hydroxybutyl acrylate, tetrahydrofurfuryl acrylate, benzyl acrylate, ethylcarbitol acrylate, phenoxyethyl acrylate, methoxytriethylene glycol acrylate, monopentaerythritol acrylate, dipentaerythritol acrylate, tripentaerythritol acrylate, polypentaerythritol acrylate, and the like.

Exemplary difunctional (meth)acrylates include hexanediol dimethacrylate, hydroxyacryloyloxypropyl methacrylate, hexanediol diacrylate, urethane acrylate, epoxyacrylate, bisphenol A-type epoxyacrylate, modified epoxyacrylate, fatty acid-modified epoxyacrylate, amine-modified bisphenol A-type epoxyacrylate, allyl methacrylate, ethylene glycol dimethacrylate, diethylene glycol dimethacrylate, ethoxylated bisphenol A dimethacrylate, tricyclodecanedimethanol dimethacrylate, glycerin dimethacrylate, polypropylene glycol diacrylate, propoxylated ethoxylated bisphenol A diacrylate, 9,9-bis(4-(2-acryloyloxyethoxy)phenyl) fluorene, tricyclodecane diacrylate, dipropylene glycol diacrylate, polypropylene glycol diacrylate, PO-modified neopentyl glycol diacrylate, tricyclodecanedimethanol diacrylate, 1,12-dodecanediol dimethacrylate, and the like.

Exemplary trifunctional (meth)acrylates include trimethylolpropane trimethacrylate, trimethylolpropane triacrylate, trimethylolpropane ethoxy triacrylate, polyether triacrylate, glycerin propoxy triacrylate, and the like.

Exemplary polyfunctional (meth)acrylates include dipentaerythritol polyacrylate, dipentaerythritol hexaacrylate, pentaerythritol tetraacrylate, pentaerythritolethoxy tetraacrylate, ditrimethylolpropane tetraacrylate, and the like.

Additional exemplary acrylates contemplated for use in the practice of the present invention include those described in U.S. Pat. No. 5,717,034, the entire contents of which are hereby incorporated by reference herein.

Cyanate Ester-Based Resins

Cyanate ester monomers contemplated for use in the practice of the present invention contain two or more ring forming cyanate (—O—C≡N) groups which cyclotrimerize to form substituted triazine rings upon heating. Because no leaving groups or volatile byproducts are formed during curing of the cyanate ester monomer, the curing reaction is referred to as addition polymerization. Suitable polycyanate ester monomers that may be used in the practice of the present invention include, for example, 1,1-bis(4-cyanatophenyl)methane, 1,1-bis(4-cyanatophenyl)ethane, 2,2-bis(4-cyanatophenyl)propane, bis(4-cyanatophenyl)-2,2-butane, 1,3-bis[2-(4-cyanato phenyl)propyl]benzene, bis(4-cyanatophenyl)ether, 4,4'-dicyanatodiphenyl, bis(4-cyanato-3,5-dimethylphenyl)methane, tris(4-cyanatophenyl)ethane, cyanated novolak, 1,3-bis[4-cyanatophenyl-1-(1-methylethylidene)]benzene, cyanated phenoldicyclopentadiene adduct, and the like. Polycyanate ester monomers utilized in accordance with the present invention may be readily prepared by reacting appropriate dihydric or polyhydric phenols with a cyanogen halide in the presence of an acid acceptor.

Monomers that can optionally be combined with polycyanate ester monomer(s) in accordance with the present invention are selected from those monomers which undergo addition polymerization. Such monomers include vinyl ethers, divinyl ethers, diallyl ethers, dimethacrylates, dipropargyl ethers, mixed propargyl allyl ethers, monomaleimides, bismaleimides, and the like. Examples of such monomers include cyclohexanedimethanol monovinyl ether, trisallylcyanurate, 1,1-bis(4-allyloxyphenyl)ethane, 1,1-bis(4-propargyloxyphenyl)ethane, 1,1-bis(4-allyloxyphenyl-4'-propargyloxyphenyl)ethane, dimethyltrimethylene acetal)-1-maleimidobenzene, 2,2,4-trimethylhexamethylene-1,6-bismaleimide, 2,2-bis[4-(4-maleimidophenoxy)phenyl] propane, and the like.

Additional cyanate esters contemplated for use in the practice of the present invention are well known in the art. See, for example, U.S. Pat. No. 5,718,941, the entire contents of which are hereby incorporated by reference herein.

Silicones

Silicones contemplated for use in the practice of the present invention are well known in the art. See, for example, U.S. Pat. No. 5,717,034, the entire contents of which are hereby incorporated by reference herein.

Oxetanes

Oxetanes (i.e., 1,3-propylene oxides) are heterocyclic organic compounds with the molecular formula $C_3H_6O$, having a four-membered ring with three carbon atoms and one oxygen atom. The term oxetane also refers generally to any organic compound containing an oxetane ring. See, for example, Burkhard et al., in Angew. Chem. Int. Ed. 2010, 49, 9052-9067, the entire contents of which are hereby incorporated by reference herein.

Polyester-Based Resins

Polyesters contemplated for use in the practice of the present invention refer to condensation polymers formed by the reaction of polyols (also known as polyhydric alcohols), with saturated or unsaturated dibasic acids. Typical polyols used are glycols such as ethylene glycol; acids commonly used are phthalic acid and maleic acid. Water, a by-product of esterification reactions, is continuously removed, driving the reaction to completion. The use of unsaturated polyesters and additives such as styrene lowers the viscosity of the resin. The initially liquid resin is converted to a solid by cross-linking chains. This is done by creating free radicals at unsaturated bonds, which propagate to other unsaturated bonds in adjacent molecules in a chain reaction, linking the adjacent chains in the process.

Polyurethane-Based Resins

Polyurethanes contemplated for use in the practice of the present invention refer to polymers composed of a chain of organic units joined by carbamate (urethane) links. Polyurethane polymers are formed by reacting an isocyanate with a polyol. Both the isocyanates and polyols used to make polyurethanes contain on average two or more functional groups per molecule.

Polyimide-Based Resins

Polyimides contemplated for use in the practice of the present invention refer to polymers composed of a chain of organic units joined by imide linkages (i.e., —C(O)—N(R)—C(O)). Polyimide polymers can be formed by a variety of reactions, i.e., by reacting a dianhydride and a diamine, by the reaction between a dianhydride and a diisocyanate, and the like.

Melamine-Based Resins

Melamines contemplated for use in the practice of the present invention refer to hard, thermosetting plastic materials made from melamine (i.e., 1,3,5-triazine-2,4,6-triamine) and formaldehyde by polymerization. In its butylated form, it can be dissolved in n-butanol and/or xylene. It can be used to cross-link with other resins such as alkyd, epoxy, acrylic, and polyester resins.

Urea-Formaldehyde-Based Resins

Urea-formaldehydes contemplated for use in the practice of the present invention refers to a non-transparent thermosetting resin or plastic made from urea and formaldehyde heated in the presence of a mild base such as ammonia or pyridine.

Phenol-Formaldehyde-Based Resins

Phenol-formaldehydes contemplated for use in the practice of the present invention refer to synthetic polymers obtained by the reaction of phenol or substituted phenol with formaldehyde.

Diluent

Non-reactive organic diluents contemplated for use herein facilitate handling of invention formulations as a result, for example, of lower viscosity, improved dispensibility, and the like. It is preferable that the boiling point of the diluent should be close to the filler sintering temperature so that as diluent evaporates, particles touch each other and sinter.

Organic diluents employed herein are present in the range of about 1 up to about 80 wt % of invention compositions; in some embodiments, invention formulations comprise in the range of about 2 up to about 80 wt % organic diluent; in some embodiments, invention formulations comprise in the range of about 5 up to about 80 wt % of organic diluent; in some embodiments, invention formulations comprise in the range of about 10 up to about 80 wt % of organic diluent; in some embodiments, invention formulations comprise in the range of about 20 up to about 80 wt % of organic diluent; in some embodiments, invention formulations comprise in the range of about 30 up to about 80 wt % of organic diluent; in some embodiments, invention formulations comprise in the range of about 40 up to about 80 wt % of organic diluent.

In some embodiments, invention formulations comprise in the range of about 1 up to about 60 wt % of invention compositions; in some embodiments, invention formulations comprise in the range of about 2 up to about 60 wt % organic diluent; in some embodiments, invention formulations comprise in the range of about 5 up to about 60 wt % of organic diluent; in some embodiments, invention formulations comprise in the range of about 10 up to about 60 wt % of organic diluent; in some embodiments, invention formulations comprise in the range of about 20 up to about 60 wt % of organic diluent; in some embodiments, invention formulations comprise in the range of about 30 up to about 60 wt % of organic diluent; in some embodiments, invention formulations comprise in the range of about 40 up to about 60 wt % of organic diluent.

In some embodiments, invention formulations comprise in the range of about 1 up to about 50 wt % of invention compositions; in some embodiments, invention formulations comprise in the range of about 2 up to about 50 wt % organic diluent; in some embodiments, invention formulations comprise in the range of about 5 up to about 50 wt % of organic diluent; in some embodiments, invention formulations comprise in the range of about 10 up to about 50 wt % of organic diluent; in some embodiments, invention formulations comprise in the range of about 20 up to about 50 wt % of organic diluent; in some embodiments, invention formulations comprise in the range of about 30 up to about 50 wt % of organic diluent; in some embodiments, invention formulations comprise in the range of about 40 up to about 50 wt % of organic diluent.

In some embodiments, invention formulations comprise in the range of about 2 up to about 40 wt % organic diluent; in some embodiments, invention formulations comprise in the range of about 5 up to about 40 wt % of organic diluent; in some embodiments, invention formulations comprise in the range of about 10 up to about 40 wt % of organic diluent; in some embodiments, invention formulations comprise in the range of about 20 up to about 40 wt % of organic diluent; in some embodiments, invention formulations comprise in the range of about 30 up to about 40 wt % of organic diluent.

Exemplary organic diluents include aromatic hydrocarbons (e.g., benzene, toluene, xylene, and the like), saturated hydrocarbons (e.g., hexane, cyclohexane, heptane, tetradecane), chlorinated hydrocarbons (e.g., methylene chloride, chloroform, carbon tetrachloride, dichloroethane, trichloroethylene, and the like), ethers (e.g., diethyl ether, tetrahydrofuran, dioxane, glycol ethers, monoalkyl or dialkyl ethers of ethylene glycol, and the like), polyols (e.g., polyethylene glycol, propylene glycol, polypropylene glycol, and the like), esters (e.g., ethyl acetate, butyl acetate, methoxy propyl acetate, and the like); dibasic esters (e.g., DBE-9), alpha-terpineol, beta-terpineol, kerosene, diethylene glycol ethyl ether, butyl acetate, butyl cellosolve, dibutylphthalate, butyl carbitol, butyl carbitol acetate, carbitol acetate, ethyl carbitol acetate, hexylene glycol, high boiling alcohols, ethers and esters thereof, glycol ethers, ketones (e.g., acetone, methyl ethyl ketone, and the like), amides (e.g., dimethylformamide, dimethylacetamide, and the like), heteroaromatic compounds (e.g., N-methylpyrrolidone, and the like), and the like, as well as mixtures of any two or more thereof.

In some embodiments, the diluent employed is butyl acetate, diethylene glycol monoethyl ether acetate (carbitol acetate), dipropylene glycol methyl ether, MEK, acetone, or DBE-9.

In accordance with certain embodiments of the present invention, there are provided electrically conductive compositions comprising:

in the range of about 10 up to 98.95 wt % of a particulate, conductive filler;

in the range of about 0.01 up to about 40 wt % of an organic matrix; and in the range of about 1 up to about 80 wt % of an organic diluent.

Optional Additives

In accordance with some embodiments of the present invention, the compositions described herein may further comprise one or more flow additives, adhesion promoters, rheology modifiers, toughening agents, fluxing agents, film flexibilizers, phenol-novolac hardeners, epoxy-curing catalysts (e.g., imidazole), curing agents (e.g., dicumyl peroxide), as well as mixtures of any two or more thereof.

As used herein, the term "flow additives" refers to compounds which modify the viscosity of the formulation to which they are introduced. Exemplary compounds which impart such properties include silicon polymers, ethyl acrylate/2-ethylhexyl acrylate copolymers, alkylol ammonium salts of phosphoric acid esters of ketoxime, and the like, as well as combinations of any two or more thereof.

As used herein, the term "adhesion promoters" refers to compounds which enhance the adhesive properties of the formulation to which they are introduced.

As used herein, the term "rheology modifiers" refers to additives which modify one or more physical properties of the formulation to which they are introduced.

As used herein, the term "toughening agents" refers to additives which enhance the impact resistance of the formulation to which they are introduced.

As used herein, the term "fluxing agents" refers to reducing agents which prevent oxides from forming on the surface of the molten metal.

As used herein, the term "film flexibilizers" refers to agents which impart flexibility to the films prepared from formulations containing same.

As used herein, the term "phenol-novolac hardeners" refers to materials which participate in the further interaction of reactive groups so as to increase the cross-linking thereof—thereby enhancing the stiffness thereof.

As used herein, the term "epoxy-curing catalysts" refers to reactive agents which promote oligomerization and/or polymerization of epoxy-containing moieties, e.g., imidazole.

As used herein, the term "curing agents" refers to reactive agents such as dicumyl peroxide which promote the curing of monomeric, oligomeric or polymeric materials.

Films

In accordance with another embodiment of the present invention, there are provided films comprising the reaction product obtained by drying, curing and/or sintering a thickness of at least 1 µm, but less than 25 µm of the invention compositions described herein.

In certain aspects, the thickness of the film obtained by drying, curing and/or sintering invention compositions is less than 20 µm.

In certain aspects, the thickness of the film obtained by drying, curing and/or sintering invention compositions is less than 15 µm.

In certain aspects, the thickness of the film obtained by drying, curing and/or sintering invention compositions is less than 10 µm.

In certain aspects, the thickness of the film obtained by drying, curing and/or sintering invention compositions is less than 5 µm.

Articles/Assemblies

In accordance with yet another aspect of the present invention, there are provided articles/assemblies comprising an invention film as described herein adhered to a suitable substrate therefor (e.g., EMC (epoxy molded compound), laminate substrate, dies, stacked die, wafers, flip chip packages, hybrid memory cubes, TSV devices, and the like).

Suitable substrates contemplated for use herein include polyethylene terephthalates, polymethyl methacrylates, polyolefins (e.g., polyethylenes, polypropylenes, and the like), polycarbonates, epoxy resins, polyimides, polyamides, polyesters, glass, Si die with silicon nitride passivation, Si die with polyimide passivation, BT substrates, bare Si, SR4 substrates, SR5 substrates, and the like.

Films applied in accordance with the present invention display good adhesion to the substrate to which it is applied.

As readily recognized by those of skill in the art, adhesion between the film and the substrate can be determined in a variety of ways, e.g., by ASTM standard cross-cut tape test pursuant to test method D 3359-97. Typically, the adhesion between the film and the substrate is at least level 1B, as determined by ASTM standard cross-cut tape test pursuant to test method D 3359-97. In some embodiments, adhesion comparable to at least ASTM level 1B is observed (i.e., at least 35% of the originally adhered film surface remains attached to the substrate after being subjected to the tape test). In certain embodiments of the present invention, adhesion comparable to at least ASTM level 2B is observed (i.e., at least 65% of the originally adhered film surface remains attached to the substrate after being subjected to the tape test). In certain embodiments of the present invention, adhesion comparable to at least ASTM level 3B is observed (i.e., at least 85% of the originally adhered film surface remains attached to the substrate after being subjected to the tape test). In certain embodiments of the present invention, adhesion comparable to at least ASTM level 4B is observed (i.e., at least 95% of the originally adhered film surface remains attached to the substrate after being subjected to the tape test). In certain embodiments of the present invention, adhesion comparable to at least ASTM level 5B is observed (i.e., 100% of the originally adhered film surface remains attached to the substrate after being subjected to the tape test).

In accordance with still another aspect of the present invention, there are provided articles comprising a substrate having a substantially uniform coating of invention compositions on all exposed surfaces thereof.

In some aspects, substrate is substantially uniformly coated with an invention composition on the top and any side walls of invention articles. In some aspects, the composition is dried, cured and/or sintered after application to a suitable substrate.

In accordance with additional embodiments of the present invention, there are provided methods for preparing a conductive film which imparts electromagnetic interference shielding (EMI) protection to an electronic component, said method comprising:

applying a composition according to the present invention to the electronic component by suitable means, e.g., by electrostatic spray processing, air spray processing, ultrasonic spray processing, spin coating processing, and the like, and drying, curing and/or sintering the composition.

In accordance with yet another embodiment of the present invention, there are provided methods for imparting electromagnetic interference shielding (EMI) protection to an electronic component, said methods comprising:

applying a composition according to the present invention to said electronic component by suitable means, e.g., by electrostatic spray processing, air spray processing, ultrasonic spray processing, spin coating processing, or the like, and drying, curing and/or sintering the composition.

In accordance with still another embodiment of the present invention, there are provided methods for preparing a conductive network, said method comprising:

applying a composition according to the present invention to a suitable substrate by suitable means (e.g., by electrostatic spray processing, air spray processing, ultrasonic spray processing, spin coating processing, or the like) in a predefined pattern, and thereafter drying, curing and/or sintering said composition.

In accordance with a further embodiment of the present invention, there are provided conductive networks prepared by the above-described method.

Conductive networks contemplated herein typically have a volume resistivity of no greater than about $1 \times 10^{-3}$ Ohms·cm.

Various aspects of the present invention are illustrated by the following non-limiting examples. The examples are for illustrative purposes and are not a limitation on any practice of the present invention. It will be understood that variations and modifications can be made without departing from the spirit and scope of the invention. One of ordinary skill in the art readily knows how to synthesize or commercially obtain the reagents and components described herein.

Example 1

Several nano-particulate containing formulations were prepared by adding nano silver and butyl acetate to a plastic jar, hand mixing until the mixture is homogeneous (typically about 2 min using a speed mixer). See Table 1.

TABLE 1

Formulations with different nano silver

|  | A | B |
|---|---|---|
| Nano silver with 40 nm diameter (85 wt % in diethylene glycol mono-n-butyl ether) |  | 98.81 |
| Nano silver with 90 nm diameter (85 wt % in diethylene glycol mono-n-butyl ether) | 98.81 |  |
| Butyl acetate | 1.19 | 1.19 |
| Total | 100 | 100 |
| Volume resistivity (Ω-cm) | 3.62E−06 | 4.23E−06 |

A strip of the resulting paste is cast and cured at 175° C. for 1 hr. The adhesion and volume resistivity is then tested.

Figure 2:
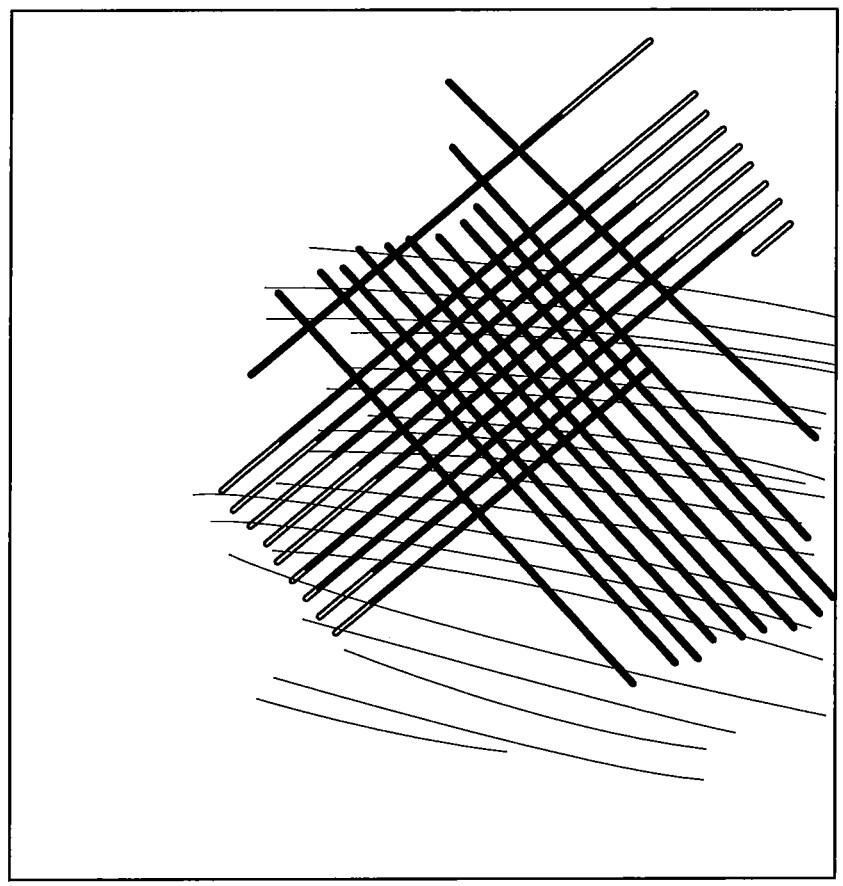
FIG. 2 shows the adhesion of exemplary conductive compositions on EMC after moisture conditioning of Formula A (see Example 1).

Both samples are seen to have excellent adhesion and volume resistivity (see FIG. 2 for exemplary results of peel testing with Formula A).

Example 2

Several thermoplastic-containing formulations were prepared by dissolving the polymers Elvacite 2021 and Elvacite 2008 in DBE-9, then adding nano-particulate silver powder into the polymer solution, then hand mixing until the mixture is homogeneous (typically about 2 min using speed mixer). See Table 2.

TABLE 2

Formulation with thermoplastics

|  | H | I | J | K |
|---|---|---|---|---|
| Nano silver with 40 nm diameter (85% in diethylene glycol mono-n-butyl ether) | 73.90 | 64.80 | 55.51 | 45.45 |
| AG-SAB-136 (Regular Silver powder, approximately 1.2 μm diameter) | 18.47 | 27.77 | 37.01 | 45.45 |
| Polymethyl acrylate with Mw ~119000 (ELVACITE 2021) | 1.39 | 1.39 | 1.39 | 1.36 |
| Polyacrylate with Mw ~37000 (ELVACITE 2008) | 1.39 | 1.39 | 1.39 | 1.36 |
| DBE-9 (solvent) | 4.86 | 4.66 | 4.71 | 6.37 |
| Total | 100 | 100 | 100 | 100 |
| Volume resistivity (Ω-cm) | 7.53E−06 | 2.08E−05 | 1.95E−05 | 1.34E−05 |

A strip of the resulting paste is cast and cured at 175° C. for 1 hr. The volume resistivity is then tested. Each of the samples are seen to have excellent volume resistivity.

Example 3

Several nano-particulate containing formulations were prepared by adding nano silver, regular silver and butyl acetate to a plastic jar, hand mixing until the mixture is homogeneous (typically about 2 min using a speed mixer). See Table 3.

TABLE 3

Formulation with nano silver/regular silver combination

|  | B | C1 | D1 | E1 | F1 | G1 |
|---|---|---|---|---|---|---|
| Nano silver with 40 nm diameter (85% in diethylene glycol mono-n-butyl ether) | 98.81 | 76.61 | 72.50 | 63.25 | 54.35 | 45.33 |
| AG-SAB-136 (Regular Silver powder, approximately 1.2 μm diameter) |  | 13.52 | 18.12 | 27.11 | 36.24 | 45.33 |
| Butyl acetate | 1.19 | 9.87 | 9.38 | 9.64 | 9.41 | 9.34 |
| Total | 100 | 100 | 100 | 100 | 100 | 100 |
| Volume resistivity (Ω-cm) | 4.23E−06 | 4.08E−06 | 3.39E−06 | 2.92E−06 | 3.11E−06 | 3.37E−06 |

A strip of the resulting paste is cast and cured at 175° C. for 1 hr. The volume resistivity is then tested. Each of the samples is seen to have excellent volume resistivity.

Example 4

Several nano-particulate containing formulations were prepared by adding nano silver, alloy 42 and butyl acetate to a plastic jar, hand mixing until the mixture is homogeneous (typically about 2 min using a speed mixer). See Table 4.

TABLE 4

Formulation with nano silver/Alloy 42 combination

|  | B | C2 | D2 |
|---|---|---|---|
| Nano silver with 40 nm diameter (85% in diethylene glycol mono-n-butyl ether) | 98.81 | 80.00 | 76.92 |
| PF-5F (Alloy 42) with particle size approximately 5 μm. |  | 12.00 | 15.38 |
| Butyl acetate | 1.19 | 8.00 | 7.70 |
| Total | 100 | 100.00 | 100 |
| Volume resistivity (Ω-cm) | 4.23E−06 | 5.76E−06 | 6.37E−06 |

A strip of the resulting paste is cast and cured at 175° C. for 1 hr. The volume resistivity is then tested. Each of the samples is seen to have excellent volume resistivity.

Example 5

Several formulations were prepared by adding Epiclon EXA 830S, Celloxide 2021 P, EP 7, Silane A 186, Ken React KR, TTS, Dicyanodiamide, Sartomer SR 285 and SF9H to a plastic jar, hand mixing until the mixture is homogeneous (typically about 2 min using a speed mixer). See Table 5.

TABLE 5

Formulation with thermoset

|  |  | Formulation A1 |
|---|---|---|
| Epiclon EXA 830 S | Bisphenol F Epoxy Resin | 1.80 |
| Celloxide 2021 P | (3',4'-Epoxycyclohexane)methyl 3,4-epoxycyclohexylcarboxylate | 5.39 |
| EP 7 | Flexible epoxy from Henkel | 4.16 |
| Silane A 186 | Beta-(3,4-Epoxycyclohexyl)ethyltrimethox | 0.26 |
| Ken React KR TTS | Isopropoxytitanium triisostearate | 0.15 |
| Dicyanodiamide | Dicyanodiamide | 0.72 |
| Sartomer SR 285 | Tetrahydrofurfuryl Acrylate | 4.90 |
| SF9H | Silver flake with approximately 4 μm particle size | 82.63 |
| Total |  | 100.00 |

Figure 3:
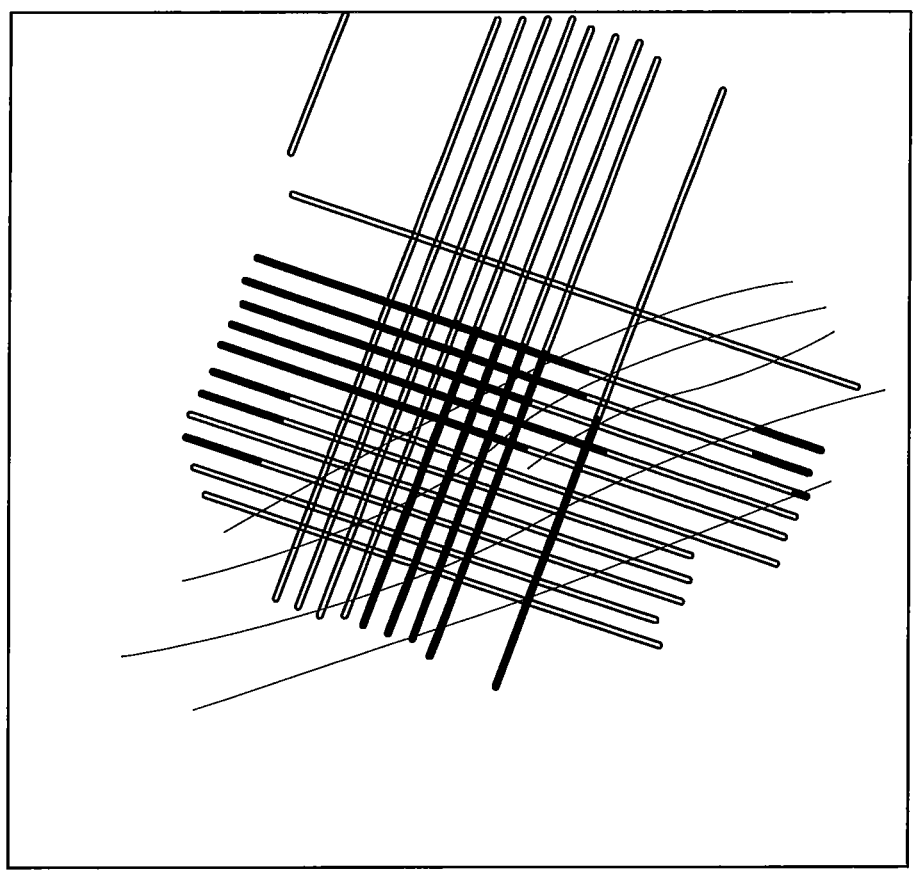
FIG. 3 illustrates the results of scratch-peel testing of the adhesion of a cured aliquot of Formula A1 (see Example 5) to an exemplary substrate.
Figure 4:
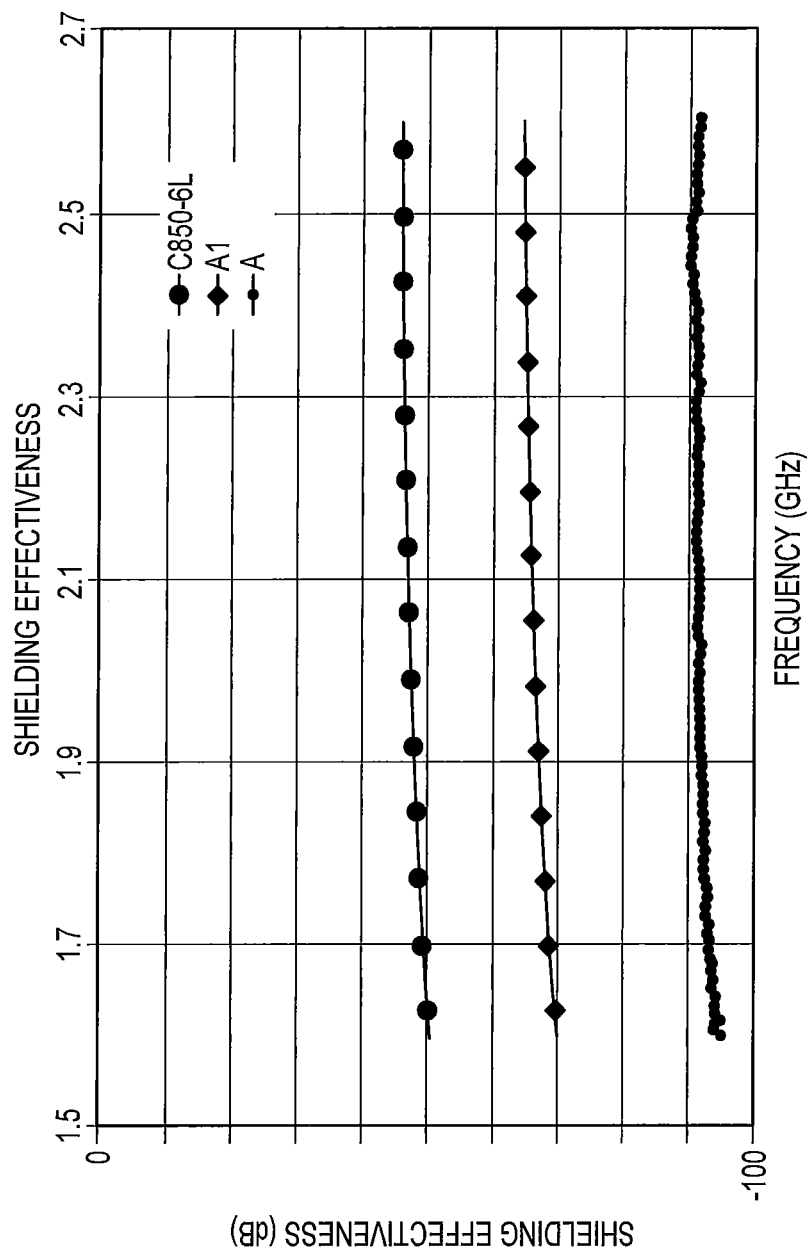
FIG. 4 summarizes the EMI shielding performance of different formulations with 5 μm thickness. C850-6L is commercially available from Henkel Electronic Materials LLC; Formula A1 is described in Example 5; and Formula A is described in Example 1. The Y axis is the EMI shielding effectiveness. The lower the number, the better the EMI shielding performance. The test results show significant EMI shielding performance improvement achieved with the formulations described herein.

A strip of the resulting paste is cast and cured at 175° C. for 1 hr. The adhesion and volume resistivity are then tested. The resulting sample has excellent volume resistivity (see FIG. 3 for exemplary results of peel testing with Formula A1).

Example 6

A silver-containing formulation was prepared by combining 2-(2-butoxyethoxy) ethyl acetate, dipropylene glycol, Luperox DI (peroxide), and AG-SAB-491 (regular silver flake). The resulting combination was hand mixed until the mixture is homogeneous. (typically about 2 min using a speed mixer). See Table 6.

TABLE 6

Formulation with regular silver

|  | A2 |
|---|---|
| 2-(2-butoxyethoxy) ethyl Acetate | 4.78 |
| dipropylene glycol | 4.78 |
| Luperox DI (peroxide) | 0.78 |
| AG-SAB-491 (regular silver flake) with particle size approximately 2 μm | 89.66 |
| Total | 100.00 |

A strip of the resulting paste is cast and cured at 175° C. for 1 hr. The volume resistivity is then tested. The resulting sample is found to have excellent volume resistivity.

Example 7

Several nano-particulate containing formulations were prepared by adding nano silver, diethylene glycol n-butyl ether and butyl acetate to a plastic jar, and hand mixing until the mixture is homogeneous (typically about 2 min using a high speed mixer). See Table 7.

TABLE 7

Highly conductive compositions with low curing temp

|  | A3 | B3 | C3 |
|---|---|---|---|
| Nano silver | 92.50 wt % | 91.85 wt % | 90.92 wt % |
| Polymer content | 0.09 wt % | 0.74 wt % | 1.67 wt % |
| Diethylenel glycol n-butyl ether (solvent 1) | 6.02 wt % | 6.02 wt % | 6.02 wt |
| Diethylenel glycol monoethyl ether (solvent 2) | 1.39 wt % | 1.39 wt % | 1.39 wt % |
| VR Ω-cm (100° C./1 hr cure) | 7.28E−06 | 1.07E−05 | 2.06E−05 |
| VR Ω-cm (120 C./1 hr cure) | 6.91E−06 | 6.94E−06 | 1.03E−05 |
| VR Ω-cm (130 C./1 hr cure) | 6.66E−06 | 6.78E−06 | 7.47E−06 |
| VR Ω-cm (150 C./1 hr cure) | 7.02E−06 | 5.92E−06 | 5.84E−06 |
| VR Ω-cm (175 C./1 hr cure) | 5.42E−06 | 4.08E−06 | 3.35E−06 |

A strip of the resulting paste is cast and cured at 100° C. to 175° C. for 1 hr. The adhesion and volume resistivity are then tested. The resulting samples are seen to have excellent volume resistivity with cure temperature ranging from 100° C. to 175° C.

Various modifications of the present invention, in addition to those shown and described herein, will be apparent to those skilled in the art of the above description. Such modifications are also intended to fall within the scope of the appended claims.

Patents and publications mentioned in the specification are indicative of the levels of those skilled in the art to which the invention pertains. These patents and publications are incorporated herein by reference to the same extent as if each individual application or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

That which is claimed is:

1. An electrically conductive sinterable composition comprising:
   in the range of about 10 up to about 98.99 wt % of a particulate, conductive filler;

in the range of about 0.01 up to about 40 wt % of an organic matrix; and in the range of about 1 up to about 80 wt % of an organic diluent;

wherein:

said particulate, conductive filler is selected from the group consisting of gold, silver, copper, platinum, palladium, nickel, aluminum, indium, alloy of nickel, alloy of zinc, alloy of iron, alloy of indium, silver-plated copper, silver-plated aluminum, bismuth, tin, bismuth-tin alloy, silver-plated fiber, silver-plated graphite, silver-plated silicon carbide, silver-plated boron nitride, silver-plated diamond, silver-plated alumina, silver-plated nickel-cadmium alloy, cadmium and alloys of cadmium, lead and alloys of lead, antimony and alloys of antimony, and mixtures of any two or more thereof; and said particulate, conductive filler has a particle size in the range of about 1 nm up to about 50 µm;

said organic matrix comprises at least one thermoplastic and/or at least one thermoset resin; and said organic diluent has a boiling point approximate to a sintering temperature of the particulate, conductive filler, and is selected from the group consisting of aromatic hydrocarbons, saturated hydrocarbons, chlorinated hydrocarbons ethers, polyols, esters, dibasic esters, alpha-terpineol, beta-terpineol, kerosene, diethylene glycol ethyl ether, butyl acetate, butyl cellosolve, dibutylphthalate, butyl carbitol, butyl carbitol acetate, carbitol acetate, ethyl carbitol acetate, hexylene glycol, alcohols, ethers and esters thereof, glycol ethers, ketones, amides, heteroaromatic compounds, as well as mixtures of any two or more thereof; and wherein said composition, upon exposure to an elevated temperature no greater than about 250° C. is sintered, and:

provides electromagnetic interference shielding (EMI) protection of at least 20 dB for electronic packages, has a volume resistivity less than $1 \times 10^{-3}$ Ohms·cm when said composition is applied to a suitable three-dimensional substrate at a thickness of less than 25 µm, and has good adhesion to said substrate.

2. The composition of claim 1 further comprising one or more flow additives, adhesion promoters, rheology modifiers, toughening agents, fluxing agents, film flexibilizers, phenol-novolac hardeners, epoxy-curing catalysts, curing agents, as well as mixtures of any two or more thereof.

3. The composition of claim 1 wherein up to 100 wt % of the particulate, conductive filler has a particle size in the range of about 2-1000 nanometers, and an average particle size in the range of about 2-1000 nm, and the remaining particulate, conductive filler has a particle size no greater than 50 microns.

4. The composition of claim 1 wherein up to 100 wt % of the particulate, conductive filler has a particle size no greater than 50 microns, and an average particle size in the range of about 1-25 µm.

5. The composition of claim 1 wherein said organic matrix comprises at least one thermoplastic resin selected from the group consisting of polyesters, polyacrylates, polyurethanes, phenoxies, polyethyloxyazoline, polyvinyl pyrrolidone, polyvinyl alcohol, polyacrylamide, polyglycol, and polyacrylic acid; poly(ethylene glycol), an aromatic vinyl polymer, flexible epoxy, polymer with epoxy functional groups, Poly carbonate, ABS, PC/ABS alloys, nylon, inherently conductive polymer, silicone polymer, siloxane polymer, rubbers, polyolefins, vinyls polymer, polyamides, fluoropolymers polyphenylene ethers, co-polyestercarbonates, acrylonitrile butadiene styrene copolymers, polyarylate ether sulfones or ketones, polyamide imides, polyetherimides, poly(ethylene terephthalate), poly(1,4-butylene terephthalate), polyethylenes, polypropylenes, polypropylene-EPDM blends, butadienes, styrene-butadienes, nitriles, chlorosulfonates, neoprenes, acrylonitrile butadiene styrene copolymers, polyetheresters, styrene/acrylonitrile polymer, polyphenylene sulfide, nitrile rubbers, cellulose resin, as well as mixtures of any two or more thereof.

6. The composition of claim 1 wherein said organic matrix comprises at least one thermoset resin selected from the group consisting of epoxies, acrylates, maleimides, nadimides, itaconimides, cyanate esters, oxetanes, polyurethanes, polyimides, melamines, urea-formaldehyde resins, phenol-formaldehyde resins, as well as mixtures of any two or more thereof.

7. The composition of claim 1 wherein exposure to an elevated temperature is effective to dry said composition.

8. The composition of claim 1 wherein exposure to an elevated temperature is effective to cure said composition.

9. A film comprising the reaction product obtained by drying, curing and/or sintering a thickness of at least 1 µm, but less than 25 µm of the composition of claim 1.

10. The film of claim 9 wherein the thickness of said composition is less than 10 µm.

11. The film of claim 9 wherein the thickness of said composition is less than 5 µm.

12. An article comprising a film according to claim 9 adhered to a suitable substrate therefor.

13. The article of claim 12, wherein the adhesion between said film and said substrate is at least level 1B, as determined by ASTM standard cross-cut tape test pursuant to test method D 3359-97.

14. An article comprising a substrate having a substantially uniform coating of the composition of claim 1 on all exposed surfaces thereof.

15. The article of claim 14 wherein said substrate is coated on the top and any side walls thereof.

16. The article of claim 14 wherein said composition has been dried, cured and/or sintered.

17. A method for preparing a conductive film which imparts electromagnetic interference shielding (EMI) protection to an electronic component, said method comprising:

applying a composition according to claim 1 to said electronic component, and drying, curing and/or sintering the composition.

18. A method for imparting electromagnetic interference shielding (EMI) protection to an electronic component, said method comprising:

applying a composition according to claim 1 to said electronic component, and drying, curing and/or sintering the composition.

19. A method for preparing a conductive network, said method comprising:

applying a composition according to claim 1 to a suitable substrate in a predefined pattern, and thereafter drying, curing and/or sintering said composition.

20. A conductive network prepared by the method of claim 19.

21. The conductive network of claim 20 having a volume resistivity of no greater than $1 \times 10^{-3}$ Ohms·cm.

* * * * *

UNITED STATES PATENT AND TRADEMARK OFFICE
CERTIFICATE OF CORRECTION

PATENT NO. : 10,858,523 B2
APPLICATION NO. : 15/878848
DATED : December 8, 2020
INVENTOR(S) : Junbo Gao et al.

Page 1 of 1

It is certified that error appears in the above-identified patent and that said Letters Patent is hereby corrected as shown below:

In the Specification

Column 15, Lines 3-4 change "amino alkynylarylene" to --aminoalkynylarylene--.

Column 16, Lines 27-28 change "dimethyltrimethylene acetal)-1-maleimidobenzene" to --3-(2,2-dimethyltrimethylene acetal)-1-maleimidobenzene--.

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*